(12) United States Patent
Kirihata et al.

(10) Patent No.: US 6,195,300 B1
(45) Date of Patent: Feb. 27, 2001

(54) CBR REFRESH CONTROL FOR THE REDUNDANCY ARRAY

(75) Inventors: Toshiaki Kirihata, Poughkeepsie, NY (US); Alexander Mitwalsky, Dresden (DE)

(73) Assignees: International Business Machines Corporation, Armonk, NY (US); Infineon Technologies North America, Corp., Munich (DE)

( * ) Notice: Subject to any disclaimer, the term of this patent is extended or adjusted under 35 U.S.C. 154(b) by 0 days.

(21) Appl. No.: 09/536,185

(22) Filed: Mar. 24, 2000

(51) Int. Cl.$^7$ .................................................. G11C 7/00
(52) U.S. Cl. ................................. 365/200; 365/222
(58) Field of Search .......................... 365/200, 222, 365/236, 230.03

(56) References Cited

U.S. PATENT DOCUMENTS

| | | | |
|---|---|---|---|
| 5,691,946 | 11/1997 | DeBrosse et al. | 365/200 |
| 5,973,976 | * 10/1999 | Sato | 365/222 |
| 5,991,218 | * 11/1999 | Kushiyama | 365/222 |

* cited by examiner

Primary Examiner—Trong Phan
(74) Attorney, Agent, or Firm—Donald B. Paschburg (57) ABSTRACT

According to one aspect of the invention, there is provided a method for refreshing memory cells in semiconductor memories. The method includes the steps of providing a semiconductor memory having memory cells and redundancy memory cells in at least one memory array and an associated redundancy memory array, respectively. The memory cells and the redundancy memory cells are independently refreshed, using addresses generated by a row address counter and a redundancy address counter, respectively. The method optionally includes the step of disabling redundancy wordlines coupled to unused redundancy memory cells, using a master fuse signal corresponding to a master fuse of the semiconductor memory.

17 Claims, 8 Drawing Sheets

CBR REFRESH CONTROL FOR THE REDUNDANCY ARRAY

FIELD OF THE INVENTION

The present invention relates generally to semiconductor memories and, in particular, to a method and system for refreshing memory cells in a semiconductor memory.

BACKGROUND OF THE INVENTION

Generally, dynamic random access memories (DRAMS) are organized in a structure of two-dimensional cells in rows and columns. Memory cells may be accessed via wordlines, which are driven from row paths. Each cross point realizes an access to cell information of each cell connected to a selected wordline.

To achieve a high yield efficiency in semiconductor memories, redundancy array architecture is employed. Redundancy arrays are described by: Kalter et al., in "A 50-ns 16 MB DRAM with a 10-ns Rate and On-Chip ECC", IEEE Solid-State Circuits, Vol. 25, No. 5, Oct. 1990; and T. Kirihata, in "Fault-Tolerant Designs for 256 Mb DRAM", IEEE Solid-State Circuits, Vol. 31, No. 4, Apr. 1996, pp. 558–566. To distinguish non-redundancy memory arrays, cells, and wordlines from redundancy memory arrays, cells, and wordlines, the former group are hereinafter referred to as normal memory arrays, cells, and wordlines.

Figure 1:
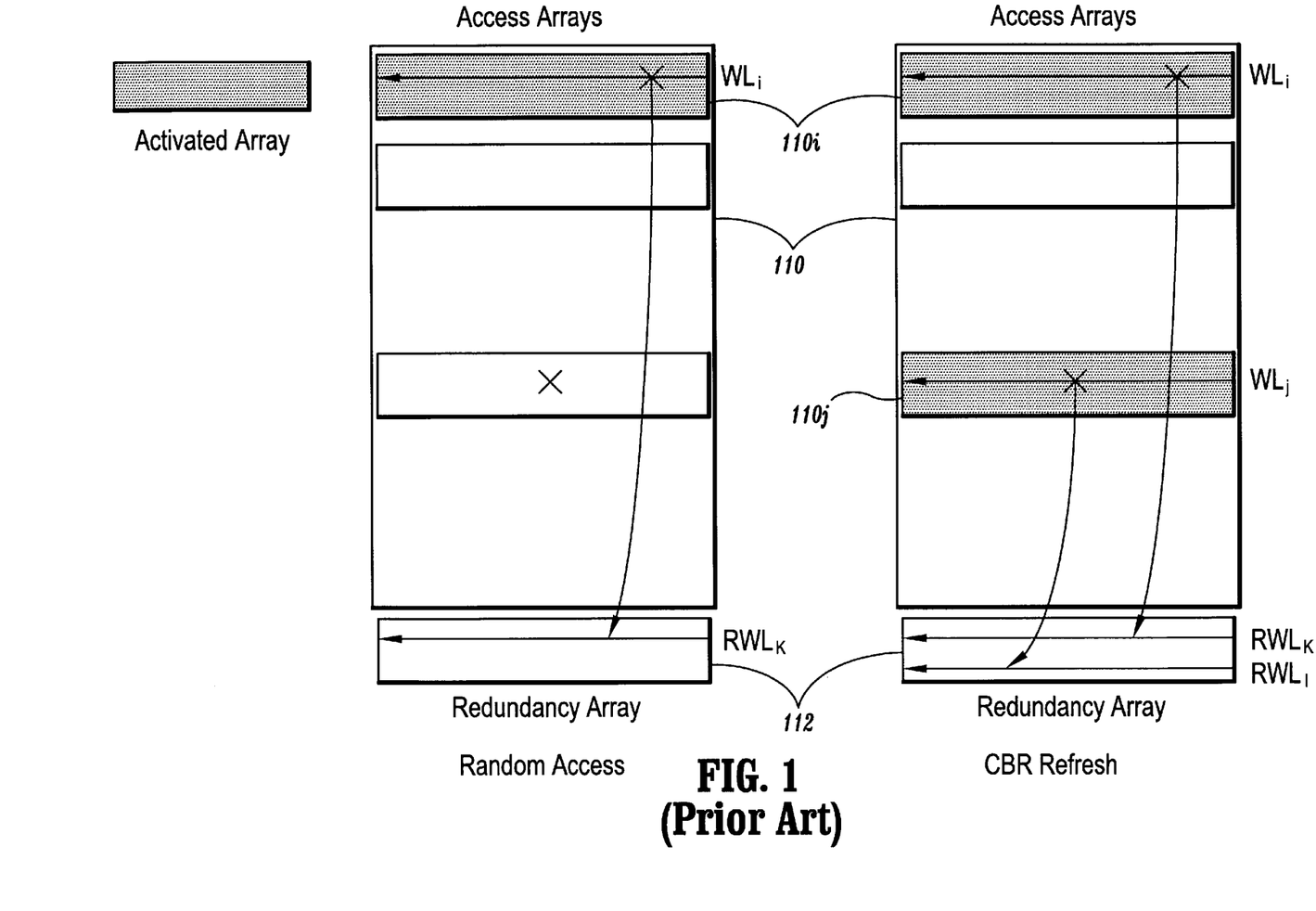
FIG. 1 is a diagram illustrating a common structure of a DRAM that includes a redundancy array, according to the prior art.

Redundancy array architecture allows a defective normal wordline $WL_i$ in any normal array to be replaced with a redundancy wordline $RWL_k$ in the redundancy array. In this scheme flexibility is high, and the number of reparable normal wordlines is increased. FIG. 1 is a diagram illustrating a common structure of a DRAM that includes a plurality of normal memory arrays 110 and a redundancy memory array 112, according to the prior art. A random access mode and a Cas-Before-Ras (CBR) mode of the DRAM arrays are depicted on the left and right sides of FIG. 1, respectively.

The random access mode allows data to be read from, or written to, DRAM cells coupling the corresponding normal wordline $WL_i$ in the activated normal memory array $110i$ (in a normal random access mode). If the normal wordline $WL_i$ is defective, it is replaced with the redundancy wordline $RWL_k$ in the redundancy memory array 112, allowing data to be read from, or written to, the DRAM cells coupling to the redundancy wordline $RWL_k$ (in a redundancy random access mode).

Due to the volatile nature of data storage in a DRAM cell, the DRAM includes a refresh operation that recharges the data of the DRAM cells. This refresh operation is generally enabled by a Cas-Before-Ras (CBR) command, and is called in a CBR mode. The CBR mode allows data to be refreshed for the DRAM cells coupling the corresponding normal wordline $WL_i$ in the activated normal memory array $110i$ (in a normal CBR mode). If the normal wordline $WL_i$ is defective, it is replaced with the redundancy wordline $RWL_k$ in the redundancy memory array 112 (in a redundancy CBR mode).

As the DRAM density increases, a CBR mode should activate more memory arrays (e.g., $110i$ and $110j$) simultaneously than those activated in a random access mode. This is because activating more arrays refreshes more cells simultaneously in the CBR mode, thereby improving the random access mode utilization. Such a refreshing technique is commonly used for 64 Mb and larger DRAMs.

When a CBR mode needs to activate more than one memory array in the DRAM, there is a possibility of having more than one normal wordline $WL_i$ and $WL_j$ simultaneously replaced with the corresponding redundancy wordlines $RWL_k$ and $RWL_l$, respectively. In this case, the chip becomes irreparable, because the bit data accessed by the redundancy wordlines $RWL_k$ and $RWL_l$ are conflicted on the bit-lines of the redundancy memory array 112. That is, since the pair of normal wordlines $WL_i$ and $WL_j$ are typically addressed together at the same time, they cannot be replaced with redundant wordlines in the redundancy memory array 112. This is because the row address signal addressing the pair of wordlines at the same time can address only one redundant wordline at a time in the redundancy memory array 112. While the use of two redundancy arrays would overcome the preceding problem, such use requires additional area to support the two redundancy arrays. Further, as the DRAM density increases, more wordlines may be activated simultaneously in a CBR mode. This increases the probability of the redundancy array contention.

Accordingly, based on the above description of the prior art, it would be desirable and highly advantageous to have a method that solves the problem of redundancy access contention in a CBR mode, without increasing the DRAM chip size.

SUMMARY OF THE INVENTION

The problem stated above, as well as other related problems of the prior art, are solved by the present invention, a method and system for refreshing memory cells in a semiconductor memory. According to the present invention, normal memory cells and redundancy memory cells are independently refreshed, using a row address counter and a redundancy address counter, respectively. Preferably, redundancy memory cells are refreshed during the process of refreshing the normal memory cells, since no additional cycle time would be required. By using the master fuse signal, the redundancy memory cells accessed by only programmed redundancy wordlines are refreshed, avoiding the potential problem caused by selecting defective redundancy wordlines. Thus, the present invention advantageously solves the problem of having more than one redundancy wordline in the redundancy array selected simultaneously, while successfully refreshing the redundancy memory cells.

According to a first aspect of the invention, there is provided a method for refreshing memory cells in semiconductor memories. The method includes the steps of providing a semiconductor memory having normal memory cells and redundancy memory cells in at least one normal memory array and an associated redundancy memory array, respectively. The normal memory cells and the redundancy memory cells are independently refreshed, using addresses generated by a row address counter and a redundancy address counter, respectively.

According to a second aspect of the invention, the method further includes the step of disabling redundancy wordlines coupled to unused redundancy memory cells, using a master fuse signal corresponding to a master fuse of the semiconductor memory.

According to a third aspect of the invention, the method further includes the step of disabling wordlines coupled to defective memory cells.

According to a fourth aspect of the invention, the disabling step is performed in one of Cas-Before-Ras (CBR) refresh mode, a self refresh mode, and an auto refresh mode.

According to a fifth aspect of the invention, the refreshing step includes the step of refreshing only the redundancy memory cells accessed by programmed redundancy wordlines, using a master fuse signal corresponding to a master fuse of the semiconductor memory.

According to a sixth aspect of the invention, the method further includes the step of independently and simultaneously refreshing the normal memory cells and the redundancy memory cells in a refresh mode.

According to a seventh aspect of the invention, the method further includes the step of activating a plurality of redundancy memory cells corresponding to a given wordline, when a normal wordline address ADR corresponding to the given wordline is detected in the random access mode that has been preprogrammed by a plurality of fuses.

According to an eighth aspect of the invention, the activating step is performed in the random access mode.

According to a ninth aspect of the invention, the refreshing step is performed in one of a Cas-Before-Ras (CBR) refresh mode, a self refresh mode, and an auto refresh mode.

According to a tenth aspect of the invention, the normal memory cells and the redundancy memory cells are refreshed simultaneously.

According to an eleventh aspect of the invention, there is provided a system for refreshing memory cells in a semiconductor memory. The semiconductor memory has normal memory cells and redundancy memory cells in at least one normal memory array and an associated redundancy memory array, respectively. The system includes a row address counter adapted to refresh the memory cells independently with respect to the redundancy memory cells. A redundancy address counter is adapted to refresh the redundancy memory cells independently with respect to the normal memory cells.

These and other aspects, features and advantages of the present invention will become apparent from the following detailed description of preferred embodiments, which is to be read in connection with the accompanying drawings.

DESCRIPTION OF PREFERRED EMBODIMENTS

The present invention is directed to a method and system for refreshing memory cells in a semiconductor memory having normal memory cells and redundancy memory cells in at least one normal memory array and an associated redundancy memory array, respectively. The normal memory cells and the redundancy memory cells are independently refreshed using a row address counter and a redundancy address counter, respectively. Preferably, the redundancy memory cells are refreshed during the process of refreshing the normal memory cells, so as to require no additional cycle time. To avoid the potential problem caused by selecting redundancy wordlines that are coupled to defective redundancy memory cells, only the redundancy memory cells accessed by programmed redundancy wordlines are refreshed, using the master fuse signal.

Figure 2:
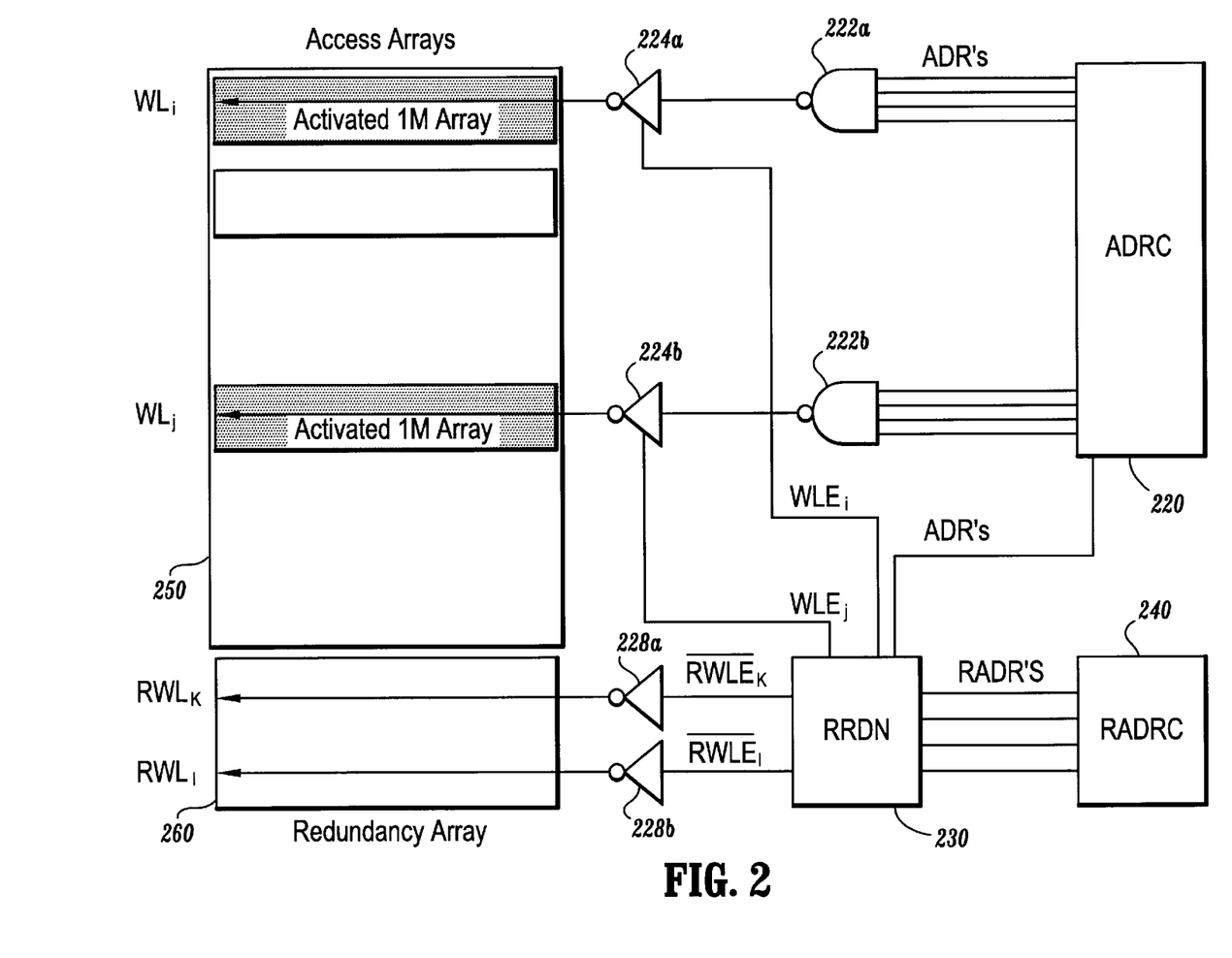
FIG. 2 is a diagram illustrating the refreshing of normal memory cells and redundancy memory cells by a memory refreshing system according to an embodiment of the present invention.

FIG. 2 is a diagram illustrating the refreshing of normal memory cells and redundancy memory cells by an memory refreshing system according to an embodiment of the present invention. A row address counter ADRC 220 generates addresses ADR's that are provided to corresponding NAND gates 222a, 222b and inverters 224a, 224b to select and enable wordlines. For the purposes of the invention, it is presumed that 2 out of 16 memory arrays in a memory 250 are activated simultaneously in the CBR refresh mode. Accordingly, corresponding normal wordlines $WLI_i$ and $WL_j$ are selected simultaneously using addresses ADR's generated by the ADRC 220, if the wordlines are not defective.

A row redundancy control circuit (RRDN) 230 contains a fuse address comparator circuit (shown in FIG. 3) for redundancy match detection. In a normal random access mode, the row redundancy control circuit RRDN 230 activates normal wordline enable control signals $WLE_i$ and $WLE_j$ for controlling inverters 224a, 224b. In both the redundancy CBR and random access modes, a normal wordline enable control signal (e.g., $WLE_i$) is not activated to a disable a corresponding defective normal wordline (e.g., $WL_i$), even if the corresponding addresses ADR's enable the corresponding wordline driver. A redundancy match detection result disables the corresponding normal wordline enable control signal WLE and enables the corresponding redundancy wordline enable control signal RWLE, when the RRDN 230 detects a wordline address ADR that has been preprogrammed by a plurality of fuses.

The row redundancy control circuit RRDN 230 generates redundancy array wordline enable control signals $\overline{RWLE}$'s, which are input to inverters 228a, 228b. The output of inverters 228a, 228b are provided to the redundancy array 260. In a random access mode, the redundancy wordlines $RWL_k$ and $RWL_l$, are controlled by the redundancy match detection result generated by the fuse address comparator circuit in the RRDN 230, which receives addresses ADR's from the row address counter ADRC 220. In a CBR mode, redundancy array wordline enable control signals $\overline{RWLE}$'s are controlled by a redundancy decoder in the RRDN 230, which receives redundancy addresses RADR's from the row redundancy control circuit RRDN 230. The redundancy addresses RADR's are generated by a redundancy address counter RADRC 240. By assigning a different redundancy address to the redundancy wordlines $RWL_k$ and $RWL_l$, the redundancy wordlines $RWL_k$ and $RWL_l$, are selected singularly in the CBR mode. This solves the problem of having two redundancy wordlines RWL's selected simultaneously in the redundancy array. Preferably, redundancy memory cells are refreshed during the process of refreshing the memory cells, requiring no additional cycle time. Alternatively, the redundancy memory cells may be refreshed after the normal memory cells are refreshed. According to a preferred embodiment of the present invention, only programmed redundancy wordlines are selected, when the corresponding redundancy addresses RADR's reach the RRDN 230. Unused redundancy wordlines are disabled by the master fuse signal MF (described with respect to FIG. 3 below) to avoid the potential problem caused by selecting defective redundancy wordlines. The master fuse signal MF identifies whether or not the address fuses are preprogrammed for the redundancy replacement.

It is to be appreciated that while the row redundancy control circuit (RRDN) 230 is shown as a single unit in FIG. 2, in a preferred embodiment of the invention there exists a single RRDN for each normal wordline enable control signal WLE and corresponding redundancy wordline enable control signal $\overline{RWLE}$. This is true irrespective of the number of WLE's and corresponding RWLE's. Each RRDN would receive addresses ADR's and redundancy addresses RADR's from the row address counter ADRC 220 and the redundancy address counter RADRC 240, respectively, to perform redundancy match detection, as described with respect to FIG. 3.

Figure 3:
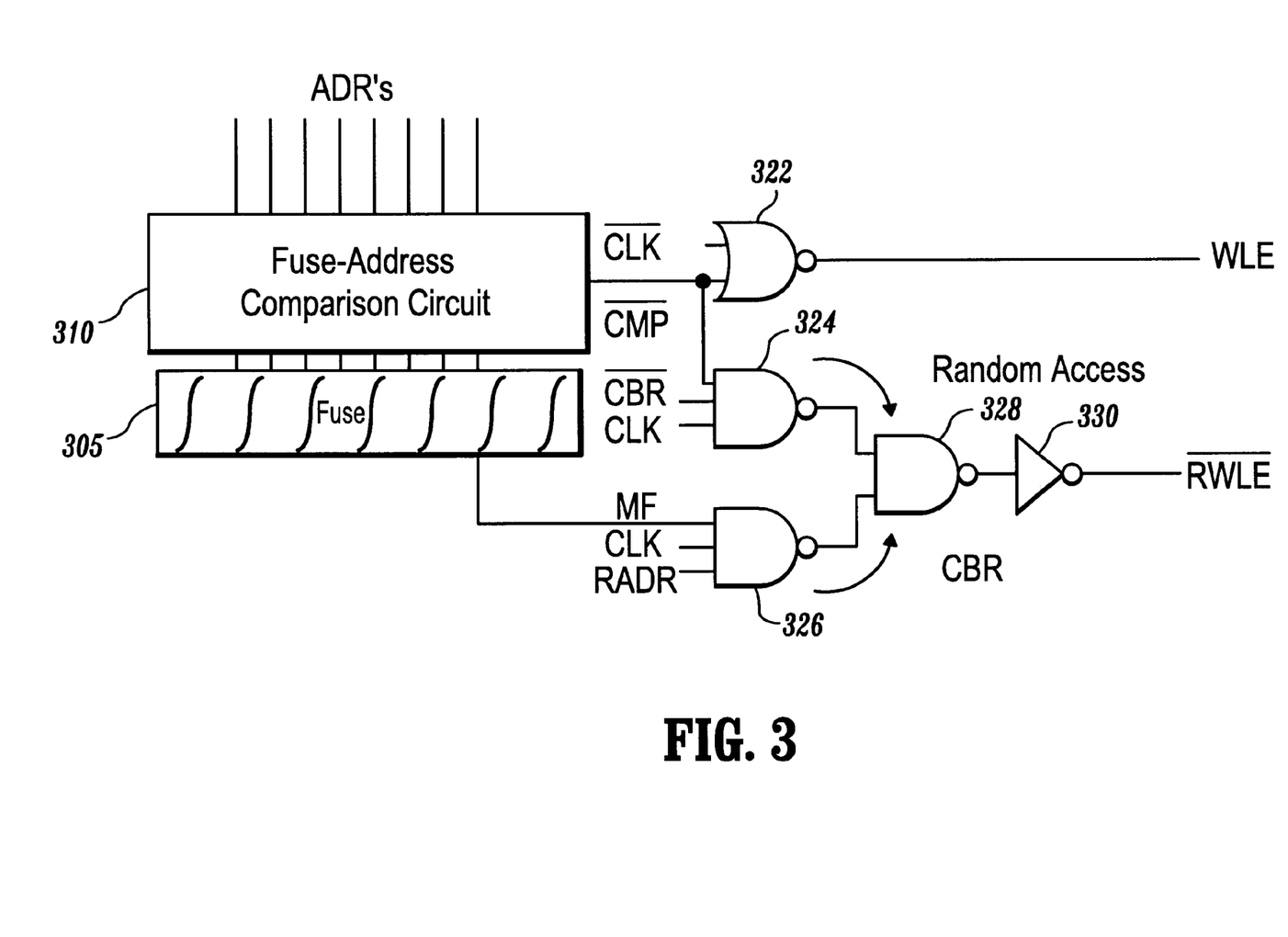
FIG. 3 is a diagram illustrating a row redundancy control circuit RRDN shown in FIG. 2, according to an embodiment of the present invention.

FIG. 3 is a diagram illustrating the row redundancy control circuit RRDN 230 of FIG. 2 according to an embodiment of the present invention. Note that the RRDN 230 receives two different address bus inputs (ADR's and RADR's). In a random access mode, an ADR bus coupled to a fuse-address comparison circuit 310 is used for controlling normal wordline enable control signals WLEs and redundancy wordline enable signals $\overline{RWLEs}$.

A first NAND gate 322 has as input a redundancy match detection result signal $\overline{CMP}$ generated from Comparison Circuit 310 and a timing clock signal $\overline{CLK}$. The output of NAND gate 322 is a normal wordline enable signal WLE. A second NAND gate 324 has as input a Cas-Before-Ras signal $\overline{CBR}$ and a timing clock signal CLK. A third NAND gate 326 (also referred to as redundancy address decoder 326) has as input the timing clock signal CLK, a Redundancy address signal RADR, and a Master Fuse signal MF corresponding to a master fuse in the fuse block 305. The outputs of NAND gates 324 and 326 are input to a fourth NAND gate 328. The output of the fourth NAND gate 328 is input to an inverter 330, which outputs a redundancy wordline enable signal $\overline{RWLE}$.

For the purposes of the invention, it is presumed that the signals WLE and $\overline{RWLE}$ activate the corresponding access wordline and the corresponding redundancy wordline, respectively. The timing clock signals $\overline{CLK}$ and CLK set the signals wordline enable WLE and redundancy wordline enable $\overline{RWLE}$, respectively.

For the purposes of the invention, it is also presumed that the signal $\overline{CBR}$ is high in the random access mode, and low in the CBR refresh mode. The Redundancy address signal RADR maintains low in the random access mode, and becomes high if it is enabled in the CBR refresh mode. The Master fuse signal MF is high if a redundancy wordline is programmed, and low if a redundancy wordline is not programmed.

Figure 4:
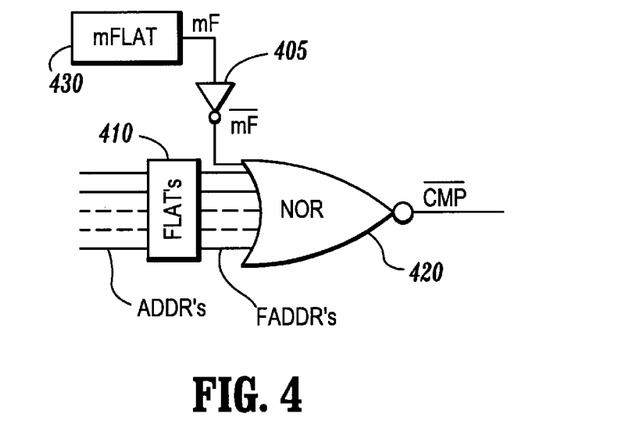
FIG. 4 is a diagram illustrating a fuse block and a fuse-address comparison circuit of FIG. 3 in further detail, according to an illustrative embodiment of the present invention.

FIG. 4 is a diagram illustrating the fuse block 305 and fuse-address comparison circuit 310 of FIG. 3 in further detail, according to an illustrative embodiment of the present invention. In the illustrative embodiment, the fuse block 305 is represented by a plurality of fuse latches (FLATS) 410 and the fuse-address comparison circuit 310 is represented by NOR gate 420. A master fuse latch (MFLAT) 430 outputs the master fuse signal to an MFLAT inverter 405. The inverter 405 is coupled to the NOR gate 420. A similar arrangement is described in U.S. Pat. No. 5,691, 946, entitled "Row Redundancy Block Architecture", issued on Nov. 25, 1997, the disclosure of which is incorporated herein by reference.

When fuses are programmed, the master fuse should be blown, making the master fuse signal MF go high and $\overline{MF}$ go low. This enables NOR gate 420. Fuse addresses (FADDR's) rise if the address ADDR does not match the programmed fuse state. The output of NOR gate 420, i.e. the redundancy match detection result signal $\overline{CMP}$, falls in normal mode, because at least one FADDR goes high. This disables the NAND gate 324 in FIG. 3 and does not activate redundancy array wordline enable control signal $\overline{RWLE}$ even when the timing clock signal CLK rises. In a redundancy mode, the redundancy match detection result signal $\overline{CMP}$ remains high, and the NAND gate 324 remain ON. The NOR gate 322 remains off and the wordline enable control signal WLE is not activated, even when $\overline{CLK}$ goes high. Thus, when the timing clock signal goes high, the redundancy array wordline enable control signal $\overline{RWLE}$ is activated. This enables the corresponding redundancy wordline driver (228 in FIG. 2), activating the corresponding redundancy wordline RWL in a redundancy array.

Figure 5:
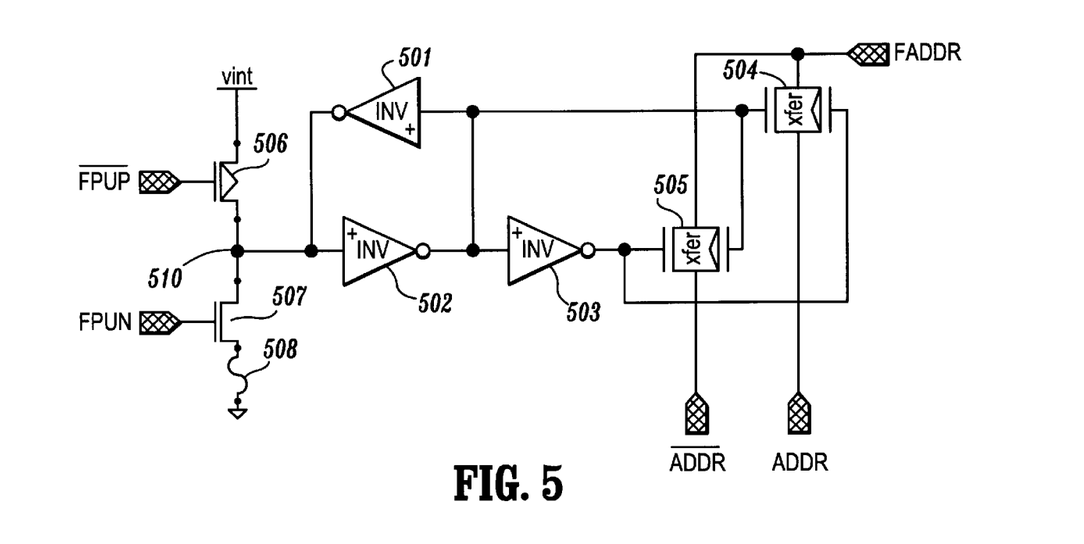
FIG. 5 is a diagram illustrating a single fuse latch of the fuse latches (FLATS) of FIG. 4, according to an illustrative embodiment of the present invention.
Figure 6:
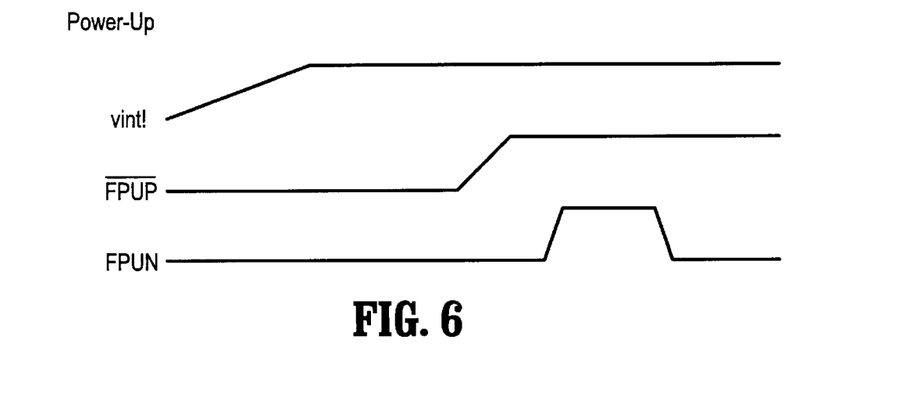
FIG. 6 is a timing diagram illustrating signals corresponding to the fuse latch (FLAT) of FIG. 5 in a power-up phase, according to an embodiment of the present invention.

FIG. 5 is a diagram illustrating a single fuse latch (FLAT) 410a of the fuse latches (FLATS) 410 of FIG. 4, according to an illustrative embodiment of the present invention. The FLAT 410a acts as an address/fuse comparator. The complementary metal oxide semiconductor (CMOS) latch is comprised of a pair of cross-inverters 501 and 502 providing complementary outputs (via inverter 503) to transfer gates 504 and 505. The FLAT 410a is set in chip power-up phase by signals $\overline{FPUP}$ and FPUN at the gates of PFET 506 and NFET 507, respectively, as shown in FIG. 6. FIG. 6 is a timing diagram illustrating signals corresponding to the fuse latch (FLAT) 410a of FIG. 5 in a power-up phase, according to an embodiment of the present invention. In particular, the timing diagram of FIG. 6 illustrates the setting of a fuse latch (i.e., FLAT 410a). The DRAM chip detects the transition of the internal voltage source (vint), to generate a PMOS fuse power up signal ($\overline{FPUP}$), and an NMOS fuse power up signal (FPUN). The signal $\overline{FPUP}$ remains low until the voltage source (vint) goes high, which naturally pre-charges a node 510 to high through the PMOS transistor 506. The pre-charge operation of the node 510 is finished when the signal $\overline{FPUP}$ goes high, which is latched by the CMOS latch (inverters 501 and 502). The pulsed FPUN signal is periodically on, changing the state of the CMOS latch (inverters 501 and 502), depending on the condition of the fuse. If the fuse is not blown, the node 510 discharges to low through the NMOS transistor 507, flipping the state of the CMOS latch (inverters 501 and 502). If the fuse is blown, the node 510 remains high.

ADDR and $\overline{ADDR}$ are true and complement row addresses, respectively. Both ADDR and $\overline{ADDR}$ are low in a standby state. Either ADDR or $\overline{\text{ADDR}}$ rises when a DRAM is activated (i.e., $\overline{\text{ADDR}}$ rises when the address is "0" and ADDR rises when the address is "1"). If a fuse 508 exists ("0" state), then the nodes 510, 511, and 512 are low, high, and low, respectively, opening the transfer gate 504. FADDR therefore follows ADDR. Alternatively, if the fuse is blown ("1" state) because the transfer gate 505 is open due to the nodes 510, 511, and 512 being high, low, and high, respectively, then FADDR follows $\overline{\text{ADDR}}$. The preceding discussion presumed that a programmed address is a "0" if the fuse is not blown and a "1" is the fuse is blown. FADDR accordingly rises when the address does not match the programmed fuse state (address/fuse unmatch detection).

Figure 7:
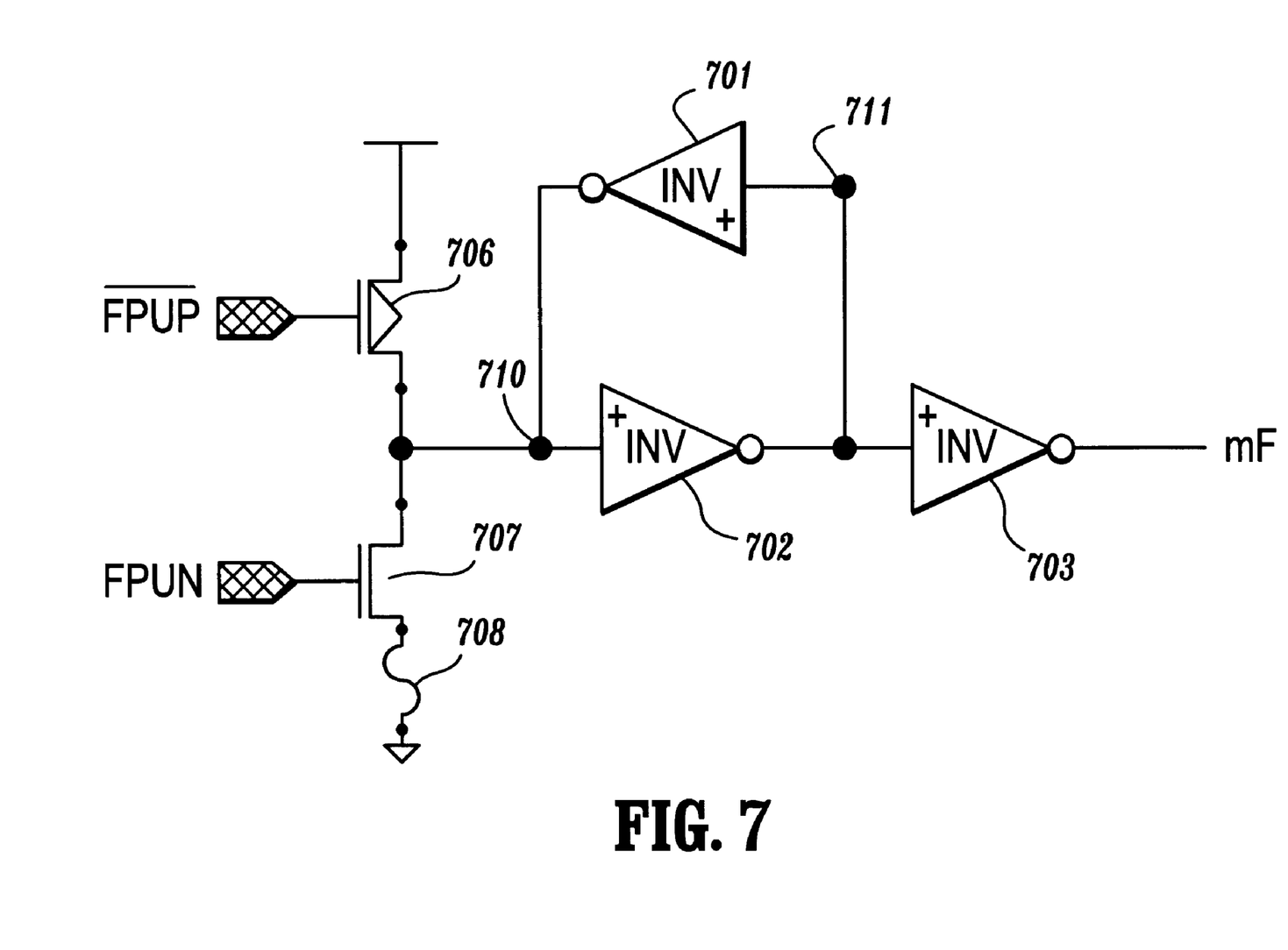
FIG. 7 is a diagram illustrating a detail of a master fuse latch (MFLAT) of FIG. 4, according to an illustrative embodiment of the present invention.

FIG. 7 is a diagram illustrating a detail of the master fuse latch (MFLAT) 430 of FIG. 4, according to an illustrative embodiment of the present invention. Similar to the fuse latch (410a) set operation described above, the node 710 is pre-charged to vint by PMOS 706. If a fuse 708 exists, then the nodes 710, 711, and MF are low, high, and low, respectively, when the NMOS 707 is periodically ON. If a fuse 708 is blown, the nodes 710, 711, and MF are high, low, and high, respectively.

Figure 8:
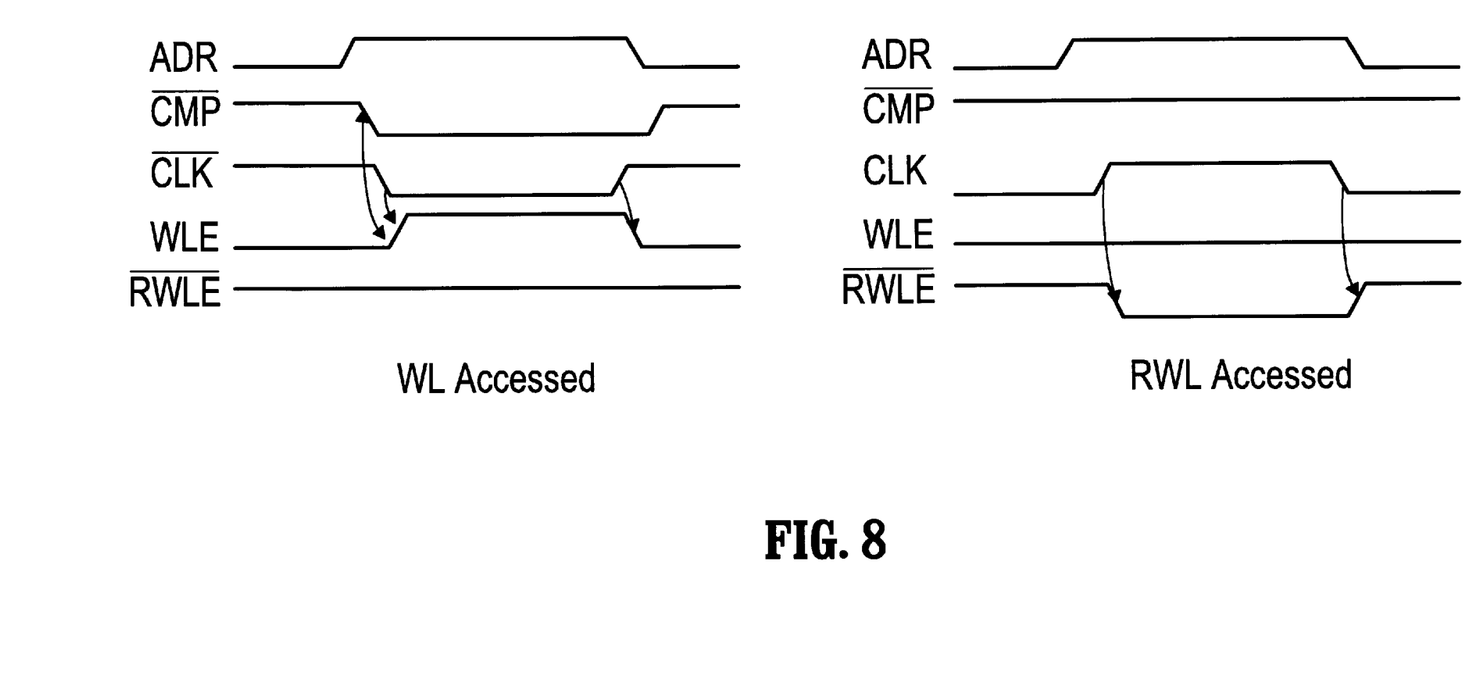
FIG. 8 is a timing diagram illustrating the relationship among the input and output signals of the RRDN of FIG. 2 in the random access mode, according to an embodiment of the present invention.

A detailed description of the operation of the present invention in the random access mode will now be given. FIG. 8 is a timing diagram illustrating the relationship among the input and output signals of the RRDN of FIG. 2 in the random access mode, according to an embodiment of the present invention. Both the wordline enable signal WLE and the redundancy wordline enable signal $\overline{\text{RWLE}}$ are controlled by the redundancy match detection result signal $\overline{\text{CMP}}$ generated by the Fuse-Address Comparison Circuit 310. For non-defective memory wordlines, the comparison result signal $\overline{\text{CMP}}$ falls when the addresses ADR's reach the Comparison Circuit 310. This makes the wordline enable signal WLE rise when the timing clock signal $\overline{\text{CLK}}$ falls. A low redundancy match detection result signal $\overline{\text{CMP}}$ disables NAND gate 324. The redundancy wordline enable signal $\overline{\text{RWLE}}$ remains at a high level, disabling the redundancy wordline.

On the other hand, when the fuses are programmed (MF=1) and the corresponding addresses ADR's reach the Comparison Circuit 310, the redundancy match detection result signal $\overline{\text{CMP}}$ maintains a high level. A high redundancy match detection result signal $\overline{\text{CMP}}$ enables NAND gate 324. As a result, the redundancy wordline enable signal $\overline{\text{RWLE}}$ falls when the timing clock signal CLK rises, allowing the redundancy wordline to be selected. A defective wordline WL is disabled because a redundancy match detection result $\overline{\text{CMP}}$ that is equal to 1 disables the NOR gate 322, irrespective of the state of the timing signal $\overline{\text{CLK}}$.

Figure 9:
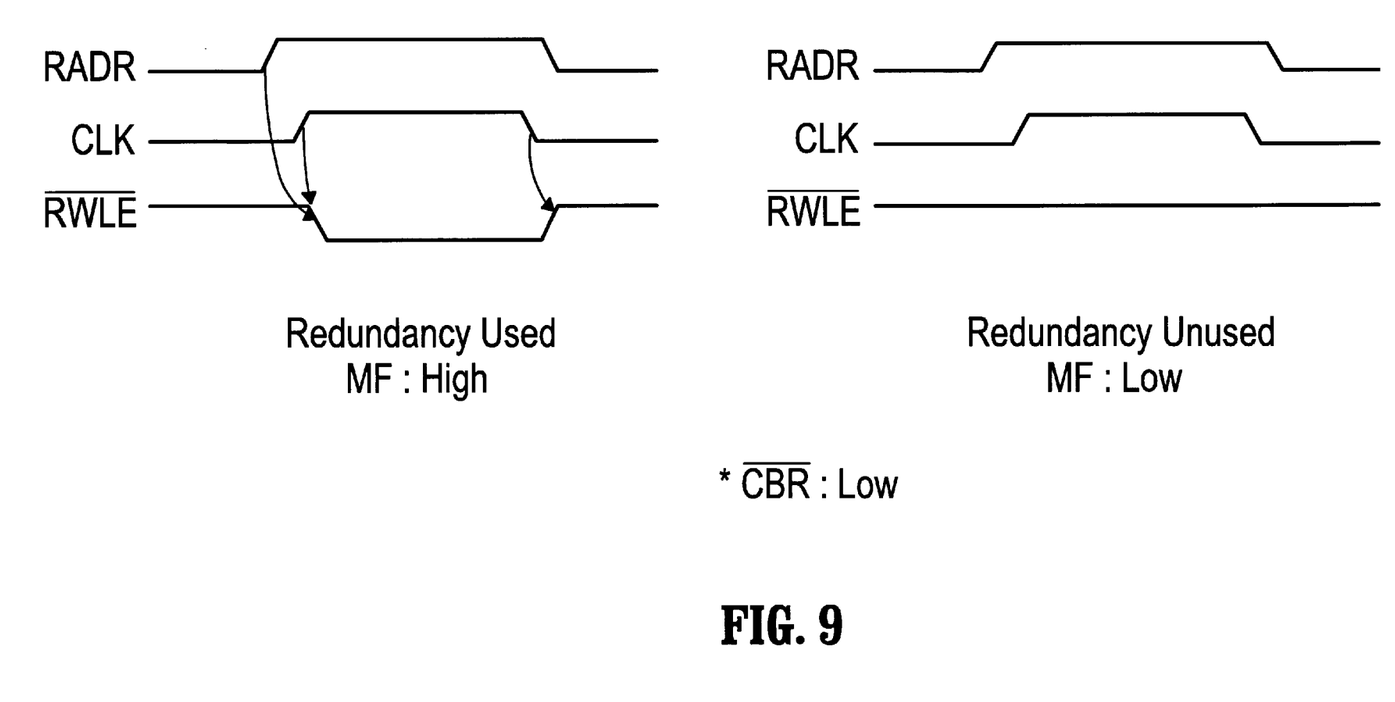
FIG. 9 is a timing diagram illustrating the relationship among the input and output signals of the RRDN of FIG. 2 in the Cas-Before-Ras (CBR) refresh mode, according to an embodiment of the present invention.

A detailed description of the operation of the present invention in the CBR refresh mode will now be given. FIG. 9 is a timing diagram illustrating the relationship among the input and output signals of the RRDN of FIG. 2 in the Cas-Before-Ras (CBR) refresh mode, according to an embodiment of the present invention. The defective memory wordlines in the CBR refresh mode are disabled by the normal wordline enable signal WLE as in the random access mode. In contrast, the redundancy wordline enable signal $\overline{\text{RWLE}}$ is controlled by redundancy addresses RADR's generated by the redundancy address counter RADRC 240 and the master fuse signal MF, which are provided to the NAND gate 326 (also referred to as redundancy address decoder 326). Note that in the random access mode, the $\overline{\text{RWLE}}$ is controlled by the redundancy match detection result $\overline{\text{CMP}}$, which is disabled by the NAND gate 324 when the Cas-Before-Ras signal $\overline{\text{CBR}}$ is equal to 0. On the other hand, NAND gate 326 can accept the redundancy address RADR if MF is high. Accordingly, the redundancy wordline enable signal $\overline{\text{RWLE}}$ falls when the corresponding redundancy address signal RADR rises. Since the master fuse signal MF is low for the unused redundancy wordline, the redundancy wordline enable signal $\overline{\text{RWLE}}$ maintains a high level even if the redundancy address signal RADR rises. It is because of this particular technique that the unused redundancy wordlines are not activated, solving the problem caused by selecting the defective redundancy wordlines.

Figure 10:
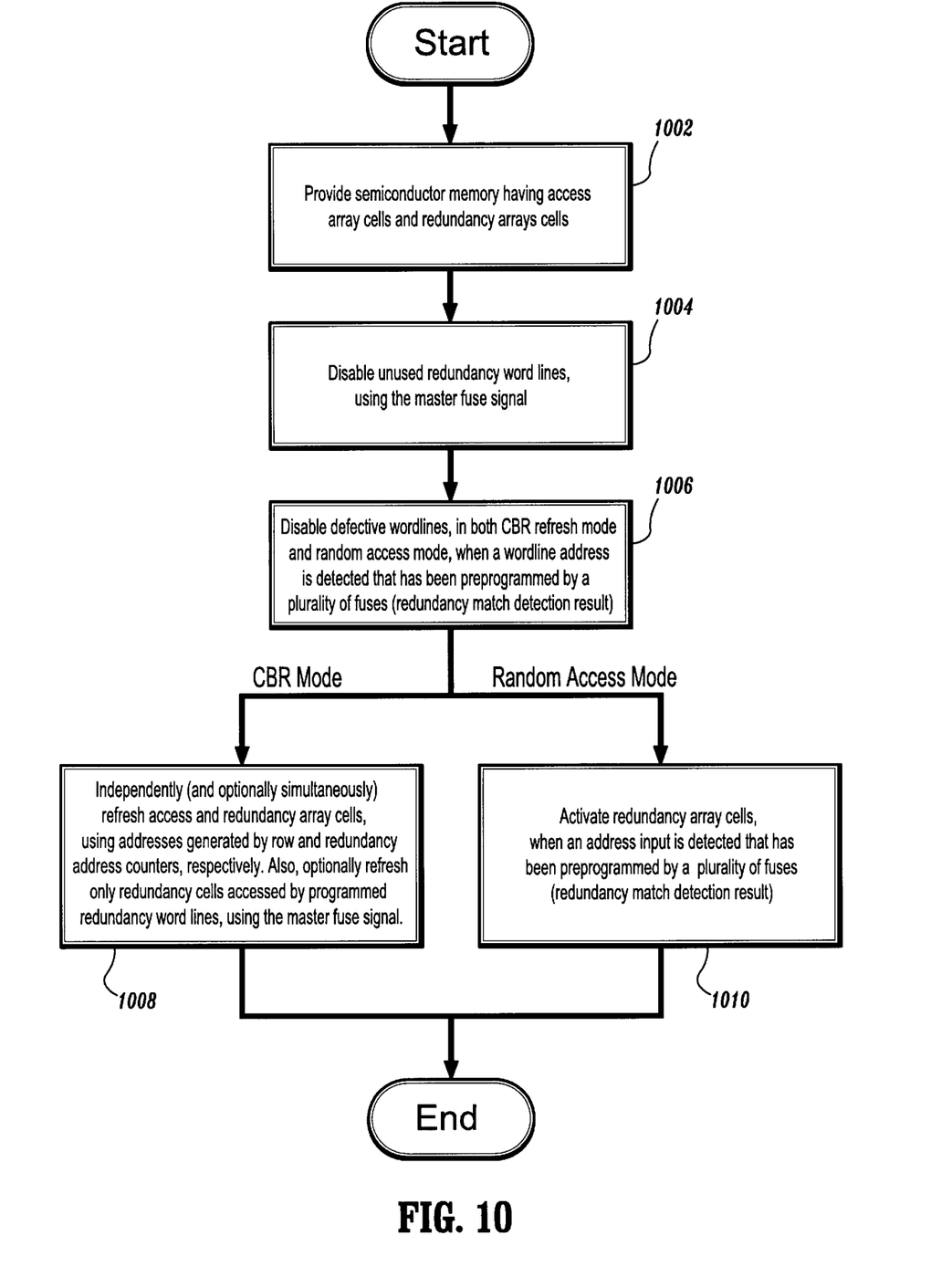
FIG. 10 is a diagram illustrating a method for refreshing redundancy wordlines in semiconductor memories, according to an embodiment of the present invention.

FIG. 10 is a diagram illustrating a method for refreshing memory cells in semiconductor memories, according to an embodiment of the present invention. A semiconductor memory is provided having normal memory cells and redundancy memory cells in at least one normal memory array and an associated redundancy array, respectively (step 1002). Redundancy wordlines coupled to unused redundancy memory cells are disabled, using the master fuse signal (step 1004). Defective normal wordlines are disabled in both the random access mode and the CBR refresh mode, when a normal wordline address ADR is detected that has been preprogrammed by a plurality of fuses (i.e., based on the redundancy match detection result $\overline{\text{CMP}}$) (step 1006). The normal memory cells and the redundancy memory cells are independently refreshed using the addresses generated by the row address counter ADRC 220 and the redundancy address counter RADRC 240, respectively (step 1008). The refreshing step is preferably performed in the CBR refresh mode. However, it is to be appreciated that the refreshing step may also be performed at any other refresh operation such as, for example, the self refresh mode or the auto refresh mode. It is to be further appreciated that the refreshing of the normal memory cells and the redundancy memory cells may optionally be performed simultaneously, so that no additional cycle time is required. Moreover, step 1008 may optionally refresh only the redundancy cells accessed by programmed redundancy wordlines, using the master fuse signal. Of course, all redundancy cells can be refreshed in step 1008, is so desired. In the random access mode, a plurality of redundancy memory cells corresponding to a given wordline are activated, when a wordline address ADR corresponding to the given wordline is detected in the random access mode that has been preprogrammed by a plurality of fuses (i.e., based on the redundancy match detection result $\overline{\text{CMP}}$) (step 1010).

Thus, the present invention advantageously provides a method and system that independently refreshes normal memory cells and redundancy memory cells of a semiconductor memory using a row address counter and a redundancy address counter, respectively. Preferably, the refreshing is performed in the Cas-Before-Ras (CBR) refresh mode. Further, it is preferable that the redundancy memory cells are refreshed during the process of refreshing the normal memory cells, so that no additional cycle time is required. To avoid the potential problem caused by selecting redundancy wordlines that are coupled to defective redundancy memory cells, the present invention may advantageously refresh only the redundancy memory cells accessed by programmed redundancy wordlines, using the master fuse signal.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed:

1. A system for refreshing memory cells in a semiconductor memory having normal memory cells and redundancy memory cells in at least one normal memory array and an associated redundancy memory array, respectively, the system comprising:

a row address counter adapted to refresh the normal memory cells independently with respect to the redundancy memory cells; and a redundancy address counter adapted to refresh the redundancy memory cells independently with respect to the normal memory cells.

2. The system according to claim 1, wherein the counters are adapted to refresh in one of a Cas-Before-Ras (CBR) refresh mode, a self refresh mode, and an auto refresh mode.

3. The system according to claim 1, further comprising a row redundancy control circuit adapted to disable normal wordlines coupled to defective normal memory cells in a refresh mode.

4. The system according to claim 1, further comprising a row redundancy control circuit adapted to disable normal wordlines coupled to defective normal memory cells in a random access mode.

5. The system according to claim 1, wherein said redundancy address counter is further adapted to refresh only the redundancy memory cells accessed by programmed redundancy wordlines, using a master fuse signal corresponding to a master fuse of the semiconductor memory.

6. The system according to claim 1, further comprising a row redundancy control circuit adapted to activate a plurality of the redundancy memory cells corresponding to a given wordline, when a wordline address ADR corresponding to the given wordline is detected in the random access mode that has been preprogrammed by a plurality of fuses.

7. The system according to claim 6, wherein said row redundancy control circuit is adapted to activate the plurality of the redundancy memory cells corresponding to the given wordline in the random access mode.

8. The system according to claim 1, wherein said counters are further adapted to refresh the normal memory cells and the redundancy memory cells simultaneously.

9. A method for refreshing memory cells in semiconductor memories, comprising the steps of:

providing a semiconductor memory having normal memory cells and redundancy memory cells in at least one normal memory array and an associated redundancy memory array, respectively; and independently refreshing the normal memory cells and the redundancy memory cells, using addresses generated by a row address counter and a redundancy address counter, respectively.

10. The method according to claim 9, further comprising the step of disabling redundancy wordlines coupled to unused redundancy memory cells, using a master fuse signal corresponding to a master fuse of the semiconductor memory.

11. The method according to claim 9, further comprising the step of disabling normal wordlines coupled to defective normal memory cells.

12. The method according to claim 11, wherein said disabling step is performed in one of a Cas-Before-Ras (CBR) refresh mode, a self refresh mode, and an auto refresh mode.

13. The method according to claim 9, wherein said refreshing step comprises the step of refreshing only the redundancy memory cells accessed by programmed redundancy wordlines, using a master fuse signal corresponding to a master fuse of the semiconductor memory.

14. The method according to claim 9, further comprising the step of activating a plurality of redundancy memory cells corresponding to a given wordline, when a wordline address ADR corresponding to the given wordline is detected in the random access mode that has been preprogrammed by a plurality of fuses.

15. The method according to claim 9, wherein said activating step is performed in the random access mode.

16. The method according to claim 9, wherein said refreshing step is performed in one of a Cas-Before-Ras (CBR) refresh mode, a self refresh mode, and an auto refresh mode.

17. The method according to claim 9, wherein the normal memory cells and the redundancy memory cells are refreshed simultaneously.

* * * * *